(12) United States Patent
Chan

(10) Patent No.: US 10,218,274 B1
(45) Date of Patent: Feb. 26, 2019

(54) SYSTEM AND METHOD FOR GENERATING A RIPPLE VOLTAGE FOR A RIPPLE BASED CONSTANT-ON-TIME DC-DC CONVERTER

(71) Applicant: NXP B.V., Eindhoven (NL)

(72) Inventor: Shufan Chan, Milpitas, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/853,308

(22) Filed: Dec. 22, 2017

(51) Int. Cl.
| H02M 3/158 | (2006.01) |
| H02M 3/156 | (2006.01) |
| H02M 1/14 | (2006.01) |
| G05F 1/625 | (2006.01) |
| H02M 1/00 | (2006.01) |

(52) U.S. Cl.
CPC .......... *H02M 3/1588* (2013.01); *G05F 1/625* (2013.01); *H02M 1/14* (2013.01); *H02M 3/1563* (2013.01); *H02M 2001/0025* (2013.01)

(58) Field of Classification Search
CPC .... H02M 3/156–3/158; H02M 3/1563; H02M 3/1584; H02M 3/1588; H02M 1/08; H02M 1/14; Y02B 70/126; Y02B 70/1466; G05F 1/625
USPC .................................. 323/222–225, 282–285
See application file for complete search history.

(56) References Cited

U.S. PATENT DOCUMENTS

| 8,446,135 | B2 | 5/2013 | Chen et al. | |
| 8,476,882 | B2 | 7/2013 | Luo et al. | |
| 8,525,505 | B2 * | 9/2013 | Wang | H02M 1/14 323/286 |
| 9,559,592 | B2 | 1/2017 | Pigott et al. | |
| 9,588,532 | B2 | 3/2017 | Rahimi et al. | |
| 2004/0263238 | A1 * | 12/2004 | Thorp | H02M 3/073 327/536 |
| 2009/0237149 | A1 * | 9/2009 | Ueda | H02M 3/073 327/536 |
| 2013/0249508 | A1 | 9/2013 | Rahimi et al. | |
| 2017/0025952 | A1 | 1/2017 | Huang | |
| 2017/0194862 | A1 | 7/2017 | Guo | |
| 2018/0083456 | A1 * | 3/2018 | Huang | H02M 3/06 |

OTHER PUBLICATIONS

Liu, Pei-Hsin et al; "Modeling and Autotuning of AVP Control with Inductor DCR Current Sensing"; IEEE 2014 Applied Power Electronics Conference and Exposition; pp. 1066-1072 (2014).

* cited by examiner

*Primary Examiner* — Yemane Mehari

(57) ABSTRACT

Embodiments of a circuit and method for generating a ripple voltage for a ripple based constant-on-time DC-DC converter are disclosed. A circuit includes a ripple voltage output, a first charging circuit connected to the ripple voltage output, a second charging circuit connected to the ripple voltage output, a charge control circuit configured to charge the first charging circuit and the second charging circuit out-of-phase from each other in response to an on signal from a ripple based constant-on-time DC-DC converter, where the voltage of the first charging circuit and the voltage of the second charging circuit are provided at the ripple voltage output as the ripple voltage.

20 Claims, 7 Drawing Sheets

SYSTEM AND METHOD FOR GENERATING A RIPPLE VOLTAGE FOR A RIPPLE BASED CONSTANT-ON-TIME DC-DC CONVERTER

BACKGROUND

Constant-on-time converters are known for their fast transient responses, ease of design, and smaller and simpler controllers. Ripple based constant-on-time DC-DC converters utilize a ripple voltage to maintain proper operation with accurate and fast output voltage regulation. A ripple voltage can be generated from sensing inductor current. However, current sensing can require complex circuitry and man not provide a fast transient response and/or good accuracy over a wide range of operating currents.

SUMMARY

Embodiments of a circuit for use with a DC-DC converter are disclosed. In an embodiment, a circuit for generating a ripple voltage for a ripple based constant-on-time DC-DC converter, is disclosed. The circuit includes a ripple voltage output, a first charging circuit connected to the ripple voltage output, a second charging circuit connected to the ripple voltage output, a charge control circuit configured to charge the first charging circuit and the second charging circuit out-of-phase from each other in response to an on signal from a ripple based constant-on-time DC-DC converter, where the voltage of the first charging circuit and the voltage of the second charging circuit are provided at the ripple voltage output as the ripple voltage.

In an embodiment, the charge control circuit is configured to charge the first charging circuit while the second charging circuit is discharging and to discharge the first charging circuit while the second charging circuit is charging.

In an embodiment, the charge control circuit includes a ramp bias generator comprising two switchable current sources and a clock generator, the clock generator configured to generate a first ripple ramp control signal in response to the on signal from the ripple based constant-on-time DC-DC converter and to generate a second ripple ramp control signal in response to the $T_{ON}$ signal from the ripple based constant-on-time DC-DC converter, wherein the first ripple ramp control signal and the second ripple ramp control signal are out-of-phase from each other.

In an embodiment, the first charging circuit includes a first charging capacitor and two switches and wherein the second charging circuit includes a second charging capacitor and two switches. In an embodiment, one of the two switches of the first charging circuit is connected between the first charging capacitor and a reference voltage and the other of the two switches of the first charging circuit is connected between the first charging capacitor and a ramp bias generator and one of the two switches of the second charging circuit is connected between the second charging capacitor and the reference voltage and the other of the two switches of the second charging circuit is connected between the second charging capacitor and the ramp bias generator.

In an embodiment, the charge control circuit includes a ripple minimum amplitude control circuit configured to compare the amplitude of the ripple voltage to a minimum reference voltage and to extend the duration of the on signal when the amplitude of the ripple voltage is less than the minimum reference voltage.

In an embodiment, the circuit includes a ripple valley clamp circuit configured to maintain a valley of the ripple voltage at least at a reference voltage.

In an embodiment, the charge control circuit includes a ramp bias generator comprising two switchable current sources and a clock generator configured to generate a first ripple ramp control signal in response to the on signal from the ripple based constant-on-time DC-DC converter and to generate a second ripple ramp control signal in response to the on signal from the ripple based constant-on-time DC-DC converter, wherein the first ripple ramp control signal and the second ripple ramp control signal are out-of-phase from each other.

In an embodiment, the first charging circuit includes a first charging capacitor and two switches and wherein the second charging circuit includes a second charging capacitor and two switches, wherein one switch of the first charging circuit and one switch of the second charging circuit are controlled by the first ripple ramp control signal and wherein one switch of the first charging circuit and one switch of the second charging circuit are controlled by the second ripple ramp control signal.

In an embodiment, one of the two switches of the first charging circuit is connected between the first charging capacitor and a reference voltage and the other of the two switches of the first charging circuit is connected between the first charging capacitor and the ramp bias generator and one of the two switches of the second charging circuit is connected between the second charging capacitor and the reference voltage and the other of the two switches of the second charging circuit is connected between the second charging capacitor and the ramp bias generator. In an embodiment, the charge control circuit includes a ripple minimum amplitude control circuit configured to compare the amplitude of the ripple voltage to a minimum reference voltage and configured to extend the duration of the on signal when the amplitude of the ripple voltage is less than the minimum reference voltage. In an embodiment, the circuit includes a ripple valley clamp circuit configured to maintain a valley of the ripple voltage at least at a reference voltage.

An inductor current ripple based constant-on-time DC-DC buck converter includes the above-described circuit.

A method for generating a ripple voltage for a ripple based constant-on-time DC-DC converter is disclosed. The method involves generating a first ripple ramp control signal in response to an on signal from the ripple based constant-on-time DC-DC converter, generating a second ripple ramp control signal in response to the on signal from the ripple based constant-on-time DC-DC converter, where the first ripple ramp control signal and the second ripple ramp control signal are out-of-phase from each other, and generating a ripple voltage in response to the first ripple ramp control signal and the second ripple ramp control signal.

In an embodiment, generating the ripple voltage in response to the first ripple ramp control signal and the second ripple ramp control signal involves controlling charging and discharging of voltage from a first charging circuit using the first ripple ramp control signal and the second ripple ramp control signal, controlling charging and discharging of voltage from a second charging circuit using the first ripple ramp control signal and the second ripple ramp control signal, and providing the voltage of the first charging circuit and the voltage of the second charging circuit as the ripple voltage.

In an embodiment, the first charging circuit is charging while the second charging circuit is discharging and the first charging circuit is discharging while the second charging circuit is charging.

In an embodiment, charging of the first charging circuit is initiated by the first ripple ramp control signal and charging of the second charging circuit is initiated by the second ripple ramp control signal.

In an embodiment, the method involves controlling the minimum amplitude of the ripple voltage to ensure that the amplitude of the ripple voltage is at least at a reference voltage.

In an embodiment, the method involves comparing the amplitude of the ripple voltage to a minimum reference voltage and extending the duration of the on signal when the amplitude of the ripple voltage is less than the minimum reference voltage.

In an embodiment, generating the ripple voltage in response to the first ripple ramp control signal and the second ripple ramp control signal involves controlling charging and discharging of voltage from a first charging circuit using the first ripple ramp control signal and the second ripple ramp control signal, controlling charging and discharging of voltage from a second charging circuit using the first ripple ramp control signal and the second ripple ramp control signal, where the first charging circuit is charging while the second charging circuit is discharging and wherein the first charging circuit is discharging while the second charging circuit is charging and where charging of the first charging circuit is initiated by the first ripple ramp control signal and charging of the second charging circuit is initiated by the second ripple ramp control signal, and providing the voltage of the first charging circuit and the voltage of the second charging circuit as the ripple voltage.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
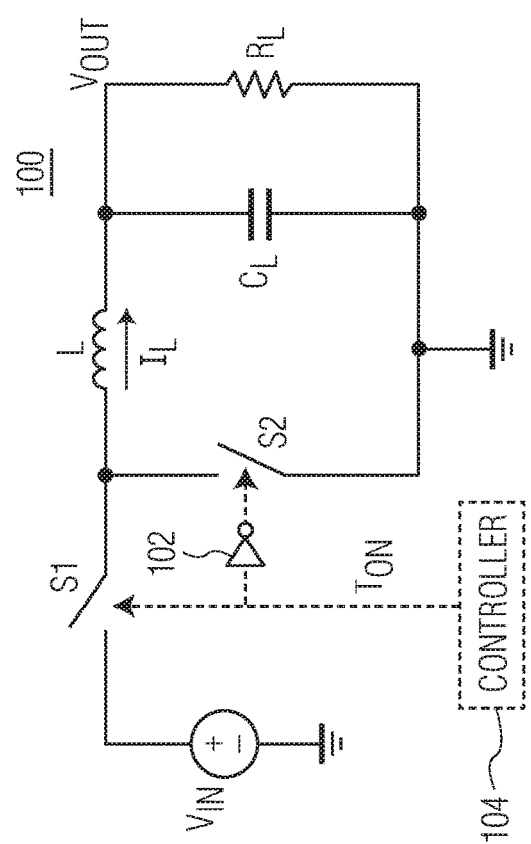
FIG. 1 shows the basic structure of a DC-DC step-down converter, also referred to as a buck converter.

FIG. 1 depicts a basic structure of a DC-DC step-down converter 100, also referred to as a buck converter. With reference to FIG. 1, the DC-DC buck converter includes a voltage source, $V_{IN}$, switches, S1 and S2, an inverter 102, a controller 104, an inductor, L, a capacitor, $C_L$, and a load, identified as a resistor, $R_L$. In various embodiments of the buck converter, the voltage source may be a battery and the switches may be PMOS and/or NMOS switches as is known in the field.

For the buck converter 100 of FIG. 1, in theory the output voltage could be anywhere from ground all the way to the input voltage, $V_{IN}$, however, there are practical limitations to these two extremes. In order to have a regulated output voltage that stays at a desired value regardless of disturbances such as load current or input variations (known as load regulations and line regulations), the controller 104 controls the switches, S1 and S2, using a control signal, referred to as the "on signal," or simply, "$T_{ON}$," where $T_{ON}$ corresponds to the amount of time that one of the switches is on such that the converter is being charged by the input voltage, $V_{IN}$.

There are many choices for the type of control, and thus the type of controller, that is applied to the converter. Some controllers provide a fixed switching frequency (known as pulse-width-modulation (PWM)) and utilize either the inductor current or the output/capacitor voltage to regulate the output voltage and fall into the categories of current-mode PWM or voltage-mode PWM controllers. There is a different category of controllers that offers faster dynamic responses compared to current-mode PWM and voltage-mode PWM controllers, which is known as ripple based controllers, or variable frequency controllers, which is a superset of ripple based controllers.

Figure 2A:
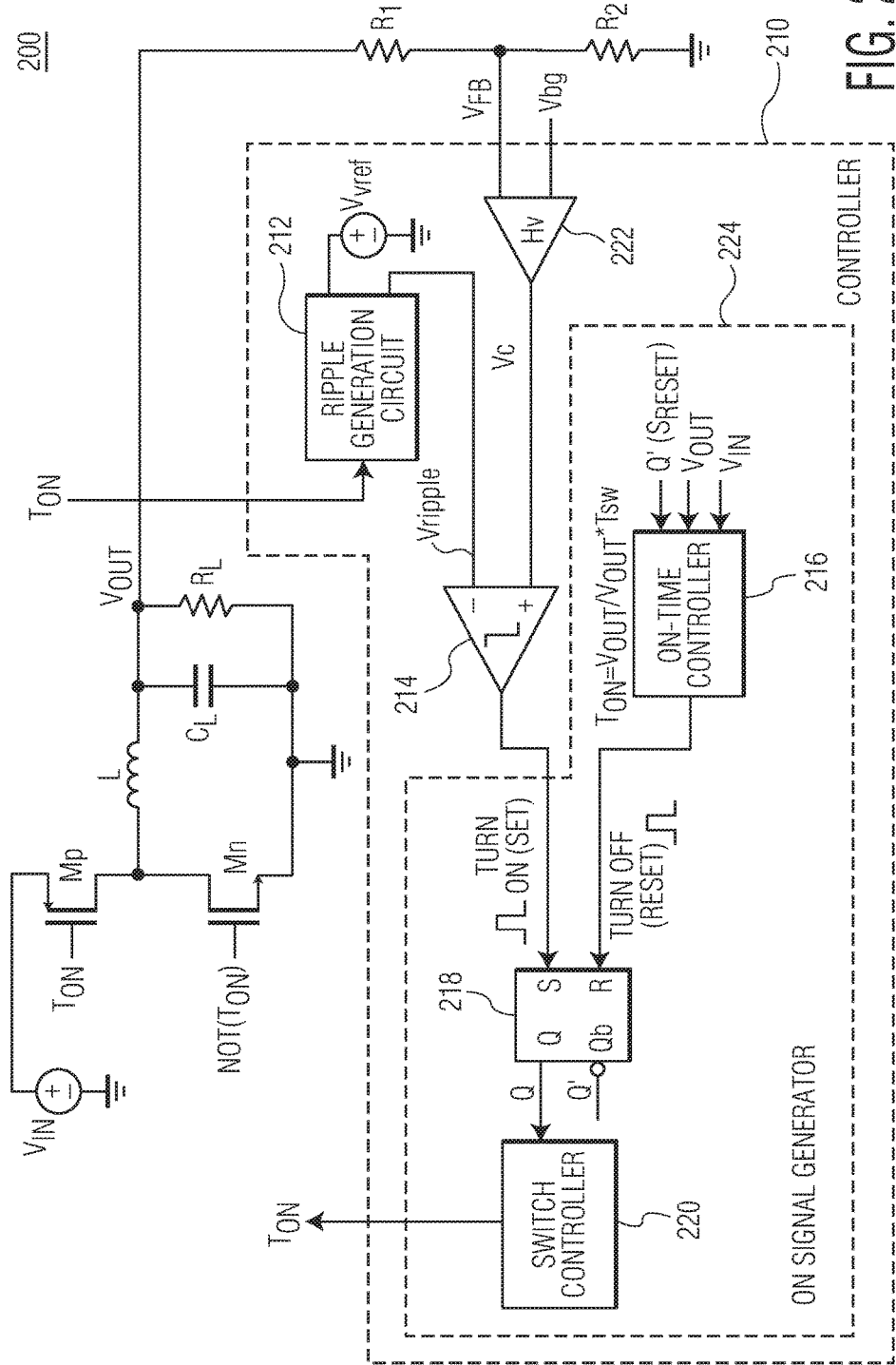
FIG. 2A is one implementation of a ripple based constant-on-time DC-DC buck converter.

Variable frequency controllers offer many advantages over fixed frequency current-mode PWM and voltage-mode PWM controllers but at the same time are not free of drawbacks. Although variable frequency controllers, such as constant-on-time controllers, provide much faster recovery from disturbances to input voltage(s) and load current(s) and have relatively simple designs, variable frequency constant-on-time controllers require the generation of a ripple voltage, which may not be a trivial operation. FIG. 2A is one implementation of a known ripple based constant-on-time buck converter 200. With reference to FIG. 2A, the ripple based constant-on-time DC-DC buck converter includes a voltage source, $V_{IN}$, an inductor, L, an NMOS switch, Mn, a PMOS switch, Mp, a capacitor, $C_L$, a load (represented as a resistor), $R_L$, a feedback resistor, $R_1$, a feedback resistor, $R_2$, and a controller 210. The controller includes a ripple generation circuit 212, a comparator 214, a feedback comparator 222, and an on signal generator 224. In the embodiment of FIG. 2A, the on signal generator includes an on-time controller 216, a set/reset (SR) latch 218, and a switch controller 220. Although an embodiment of a controller for a ripple based constant-on-time DC-DC converter are described with reference to FIG. 2A, other embodiments of a controller for a ripple based constant-on-time controller may be implemented. Operation of the ripple based constant-on-time DC-DC converter is described below.

In the case of the ripple based constant-on-time DC-DC converter 200 of FIG. 2A, when a turn-on pulse (e.g., a "set" signal) is sent from the comparator 214, it sets the SR latch 218, causing the output of the SR latch, "Q," to go to high. A high Q signal triggers the on signal, $T_{ON}$, to go high ($T_{ON}$=1), which causes the PMOS switch, Mp, to be turned on (i.e., the PMOS switch is closed) and causes the NMOS switch, Mn, to be turned off (i.e., the NMOS switch is open), that is, in response to the on signal, $T_{ON}$, and the inverse of the on signal, not($T_{ON}$)), from the switch controller 220. At this sub-period, the inductor current increases. After a predefined "on-time" (e.g., set by design, per specs), the on-time controller 216 sends a turn-off pulse (e.g., a "reset" signal), which resets the SR latch, causing the output of the SR latch, "Q," to change to low (and causing the on signal, $T_{ON}$, to go low, $T_{ON}$=0), which causes the PMOS switch, Mp, to turn off and the NMOS switch, Mn, to turn on. At this sub-period, the inductor current decreases due to delivering energy to the load (e.g., $R_L$). During operation, the ripple voltage, $V_{ripple}$, is compared to the converted feedback voltage, $V_c$, by the comparator 214. At some point in time, the compared feedback voltage, $V_c$, exceeds the ripple voltage, $V_{ripple}$, and then the comparator 214 sends a new turn-on pulse. The controller 210 keeps providing the turn-on and turn-off signals and the DC-DC converter regulates and provides a desired output voltage.

For a given input voltage, $V_{IN}$, and output voltage, $V_{OUT}$, it should be noted that the sub-period during which the inductor, L, is being energized is fixed and at steady-state the off time stays relatively constant, so the converter switching frequency does not change. In continuous conduction mode (CCM) for a buck converter, in which the inductor current stays greater than zero all the time, the duty cycle (e.g., the time that the inductor is being energized) is expressed in equation (1) as:

$$D = V_{OUT}/V_{IN} \quad (1)$$

At steady-state, the relationship between the switching period, $T_{SW}$, and the on-time, $T_{ON}$, is expressed in equation (2) as:

$$T_{ON} = (V_{OUT}/V_{IN}) \cdot T_{SW} \quad (2)$$

Equation (2) holds for both PWM controllers in steady-state and constant on-time controllers in steady-state, and since the on-time, $T_{ON}$, is proportional to $V_{OUT}/V_{IN}$, the switching period, $T_{SW}$, becomes a constant value in steady-state. This is how a constant on-time controller generates a switching frequency (constant switching frequency) without the need for a clock.

Figure 2B:
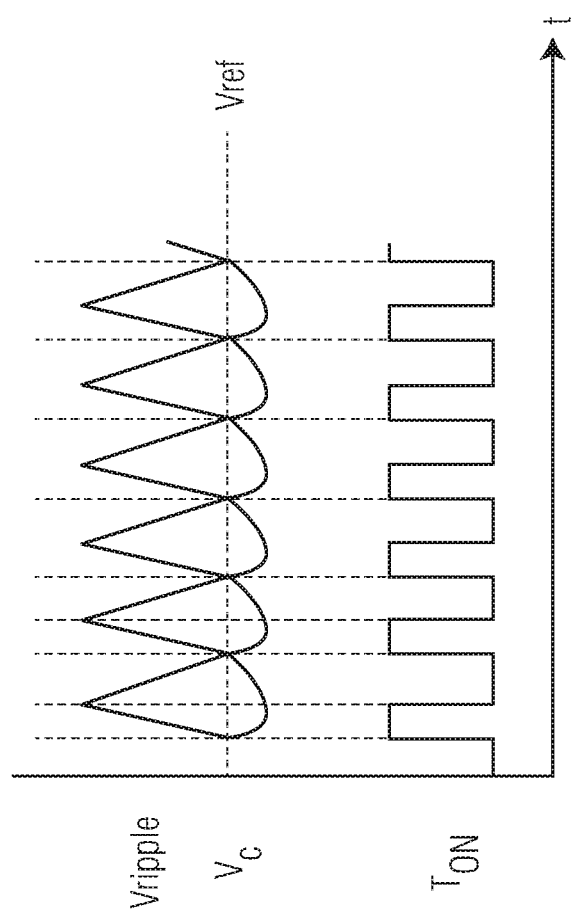
FIG. 2B is a timing diagram of a ripple voltage, $V_{ripple}$, and a compared feedback voltage, $V_c$, relative to a valley reference voltage, $V_{vref}$, and an on signal, $T_{ON}$.

FIG. 2B is a timing diagram of the ripple voltage, $V_{ripple}$, and the compared feedback voltage, $V_c$, relative to the valley reference voltage, $V_{vref}$, and the on signal, $T_{ON}$. As illustrated in the FIG. 2B, the ripple voltage increases from the valley reference voltage, $V_{vref}$, during the on-time ($T_{ON}$=1) and decreases back to the valley reference voltage, $V_{vref}$, during the off-time ($T_{ON}$=0). The compared feedback voltage decreases from the valley reference voltage, $V_{vref}$, during the on-time ($T_{ON}$=1) and increases to the valley reference voltage, $V_{vref}$, during the off-time ($T_{ON}$=0).

As indicated above, a ripple based constant-on-time DC-DC converter requires a ripple voltage, $V_{ripple}$, to combine with the feedback voltage (e.g., the compared feedback voltage, $V_c$) to control the energizing of the inductor for proper and stable voltage regulation. Thus, generation of the ripple voltage can have a significant impact on the stability and robustness of a ripple based constant-on-time DC-DC converter. Some criteria that have been found to be important for the ripple voltage are: the ripple waveform should not depend on or be sensitive to external component parasitic; the ripple waveform should operate with minimal delay and should not interfere with the stability of the feedback loop of the DC-DC converter; and the ripple waveform should maintain a robust waveform (e.g., shape and amplitude) such that the ripple based constant-on-time DC-DC converter can achieve good output voltage regulation over the operating input/output voltage range and over a switching frequency range.

In many applications, it is desirable to operate a ripple based constant-on-time DC-DC converter at a very high switching frequency. For given input/output voltage conditions and output power level, a high switching frequency enables the use of small inductance, which can result in a small device footprint and fast transient response. For a ripple based constant-on-time DC-DC converter to operate at a very high frequency, the ripple based constant-on-time DC-DC converter should have a fast ripple generator that works for both continuous conduction mode (CCM) and discontinuous conduction mode (DCM) and that is robust across operating input/output voltage and load conditions.

Various techniques have been used to generate a ripple voltage. One common technique involves inductor current sensing using a series resistor-capacitor (RC) network. The technique involves sensing the inductor current using a parallel RC network with an appropriate RC value and using the voltage across the capacitor to generate the ripple voltage. The technique requires specific sensing circuits and may not provide good accuracy because the accuracy tends to vary with the inductor parasitic resistance. Although techniques exist for generating a ripple voltage, there is still a need to generate a ripple voltage in an efficient and consistent manner and that exhibits desirable characteristics.

In an embodiment, a technique for generating a ripple voltage involves generating two separate voltages in response to the on signal, $T_{ON}$, of a ripple based constant-on-time DC-DC converter and then combining the two separate voltages in an out-of-phase manner to provide the ripple voltage. In an embodiment, a method for generating a ripple voltage for a ripple based constant-on-time DC-DC converter involves generating a first ripple ramp control signal in response to the on signal, $T_{ON}$, from the ripple based constant-on-time DC-DC converter, generating a second ripple ramp control signal in response to the on signal from the ripple based constant-on-time DC-DC converter, with the first ripple ramp control signal and the second ripple ramp control signal being out-of-phase from each other, and generating a ripple voltage in response to the first ripple ramp control signal and the second ripple ramp control signal. Because the ripple voltage is generated in response to the on signal, $T_{ON}$, the ripple voltage is generated without having to sense the inductor current of the ripple based constant-on-time DC-DC converter and because the ripple voltage is a combination of two separate voltages, the ripple current can be generated with minimal delay and with a robust waveform (shape and amplitude) that tracks the inductor current of the ripple based constant-on-time DC-DC converter.

Figure 3:
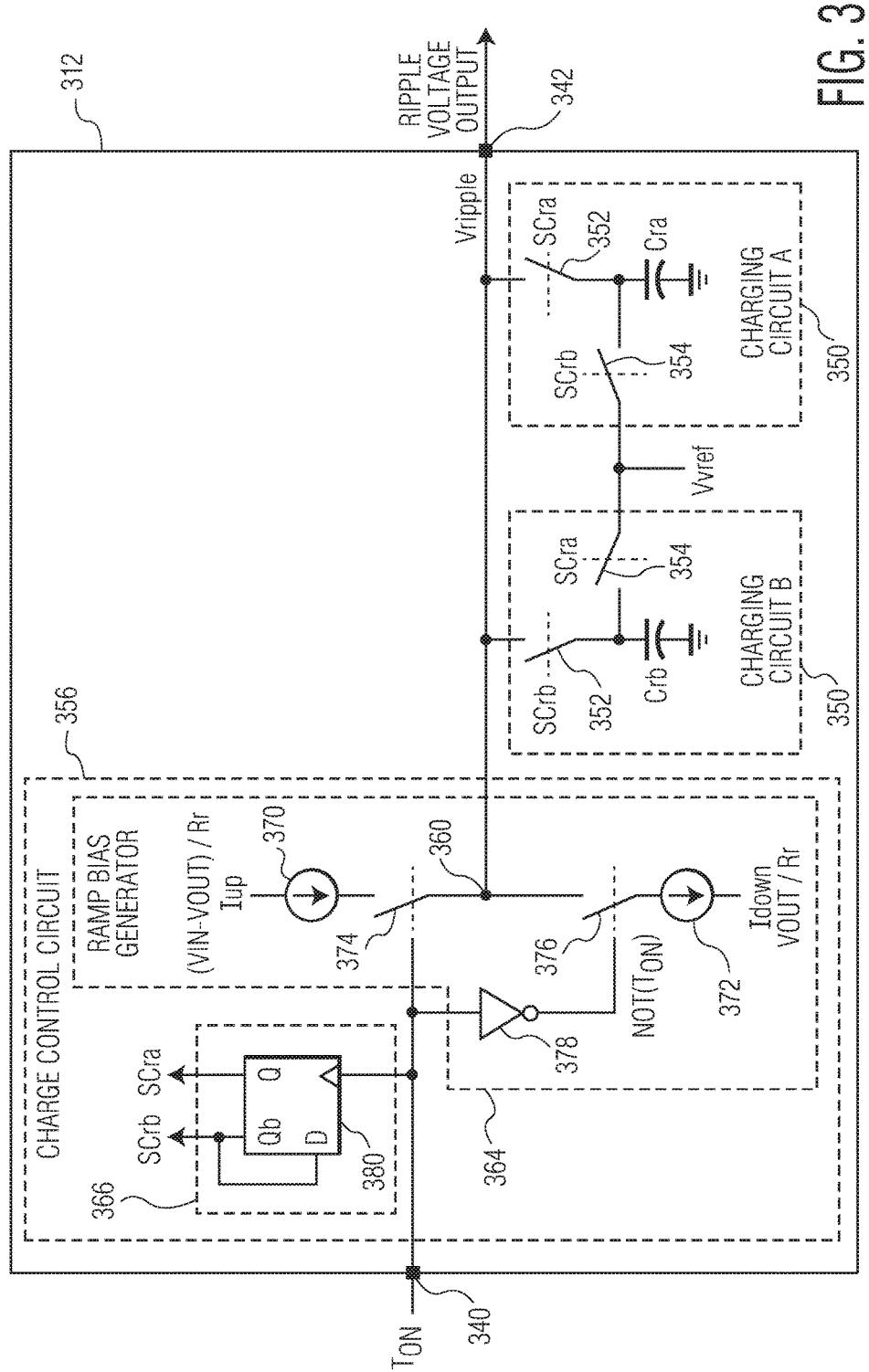
FIG. 3 depicts an embodiment of a ripple generation circuit, which can be an embodiment of the ripple generation circuit shown in FIG. 2A.

FIG. 3 depicts an embodiment of a ripple generation circuit 312, which can be an embodiment of the ripple generation circuit 212 shown in FIG. 2A. The ripple generation circuit 312 includes an interface 340 to receive the on signal, $T_{ON}$, from the controller 210 of the ripple based constant-on-time DC-DC converter 200, identified as the $T_{ON}$ signal input, and an interface 342 to output the ripple voltage, identified as the ripple voltage output. The ripple generator circuit 312 also includes a first charging circuit 350 (referred to as charging circuit A), a second charging circuit 350 (referred to as charging circuit B), and a charge control circuit 356.

The first charging circuit 350 (charging circuit A) includes a charging capacitor, Cra, a ramp switch 352 that is controlled by a first ripple ramp control signal, SCra, and a reset switch 354 that is controlled by a second ripple ramp control signal, SCrb. The ramp switch 352 connects the first charging capacitor, Cra, to the charge node 360 and the reset switch 354 connects the first charging capacitor, Cra, to the valley reference voltage, $V_{vref}$. When the ramp switch 352 is turned on (i.e., closed) by the first ripple ramp control signal, SCra, and the reset switch 354 is turned off (i.e., open) by the second ripple ramp control signal, SCrb, the voltage of the first charging capacitor, Cra, is influenced by the charge node 360. When the ramp switch 352 is turned off (i.e., open) by the first ripple ramp control signal, SCra, and the reset switch 354 is turned on (i.e., closed) by the second ripple ramp control signal, SCrb, the voltage of the first charging capacitor is reset to the valley reference voltage, $V_{vref}$.

The second charging circuit 350 (charging circuit B) includes a charging capacitor, Crb, a ramp switch 352 that is controlled by the second ripple ramp control signal, SCrb, and a reset switch 354 that is controlled by the first ripple ramp control signal, SCra. The ramp switch 352 connects the second charging capacitor, Crb, to the charge node 360 and the reset switch 354 connects the second charging capacitor, Crb, to the valley reference voltage, $V_{vref}$. When the ramp switch 352 is turned on (i.e., closed) by the second ripple ramp control signal, SCrb, and the reset switch 354 is turned off (i.e., open) by the first ripple ramp control signal, SCra, the voltage of the second charging capacitor, Crb, is influenced by the charge node 360. When the ramp switch 352 is turned off (i.e., open) by the second ripple ramp control signal, SCrb, and the reset switch 354 is turned on (i.e., closed) by the first ripple ramp control signal, SCra, the voltage of the second charging capacitor is reset to the valley reference voltage, $V_{vref}$.

In an embodiment, the charging capacitors, Cra and Crb, have a low voltage coefficient and a low temperature coefficient. For example, the charging capacitors, Cra and Crb, have a low voltage coefficient, e.g., $1/C \cdot (\Delta C/\Delta V) < 10000$ ppm/V, and a low temperature coefficient, e.g., $1/C \cdot (\Delta C/\Delta T) < 100$ ppm/° C. In an embodiment, the two charging capacitors, Cra and Crb, exhibit good matching characteristics when the two charging capacitors have the same size, e.g., the same length to width ratio.

The charge control circuit 356 includes a ramp bias generator 364 and a clock generator 366. The ramp bias generator includes two current sources 370 and 372, two switches 374 and 376, and an inverter 378. For example, current source 370 is configured such that $I_{UP}=(V_{IN}-V_{OUT})/Rr$ and current source 372 is configured such that $I_{DOWN}=(V_{OUT})/Rr$, where Rr is the resistance that is used to convert the input voltage, $V_{IN}$, and the output voltage, $V_{OUT}$, into current and the switches are CMOS switches. As illustrated in FIG. 3, the switch 374 is controlled by the on signal, $T_{ON}$, and the switch 376 is controlled by the inverse of the on signal, $T_{ON}$ (e.g., not($T_{ON}$)). In an embodiment, during the on-time (i.e., when the on signal, $T_{ON}$, is high, $T_{ON}$=1 and not($T_{ON}$)=0), the switch 374 is on (i.e., closed) and that the switch 376 is off (i.e., open), which causes the voltage at charge node 360 to increase and during the off-time (i.e., when the on signal, $T_{ON}$, is low, $T_{ON}$=0 and not($T_{ON}$)=1), the switch 374 is off (i.e., open), and the switch 376 is on (i.e., closed), which causes the voltage at the charge node 360 to decrease.

The clock generator 366 generates the first ripple ramp control signal, SCra, and the second ripple ramp control signal, SCrb, in response to the on signal, $T_{ON}$. In an embodiment, the clock generator generates the first ripple ramp control signal, SCra, and the second ripple ramp control signal, SCrb, in response to the on signal, $T_{ON}$, such that the first ripple ramp control signal, SCra, and the second ripple ramp control signal, SCrb, are out-of-phase from each other. For example, the clock generator includes a flip-flop circuit 380 that generates the first ripple ramp control signal, SCra, and the second ripple ramp control signal, SCrb, in opposite states during a first switching period (e.g., SCra=1 and SCrb=0) and then flips the states of the first ripple ramp control signal, SCra, and the second ripple ramp control signal, SCrb, during a second switching period (e.g., SCra=0 and SCrb=1). An example of the out-of-phase nature of the first and second ripple ramp control signals is described below with reference to FIG. 4.

Figure 4:
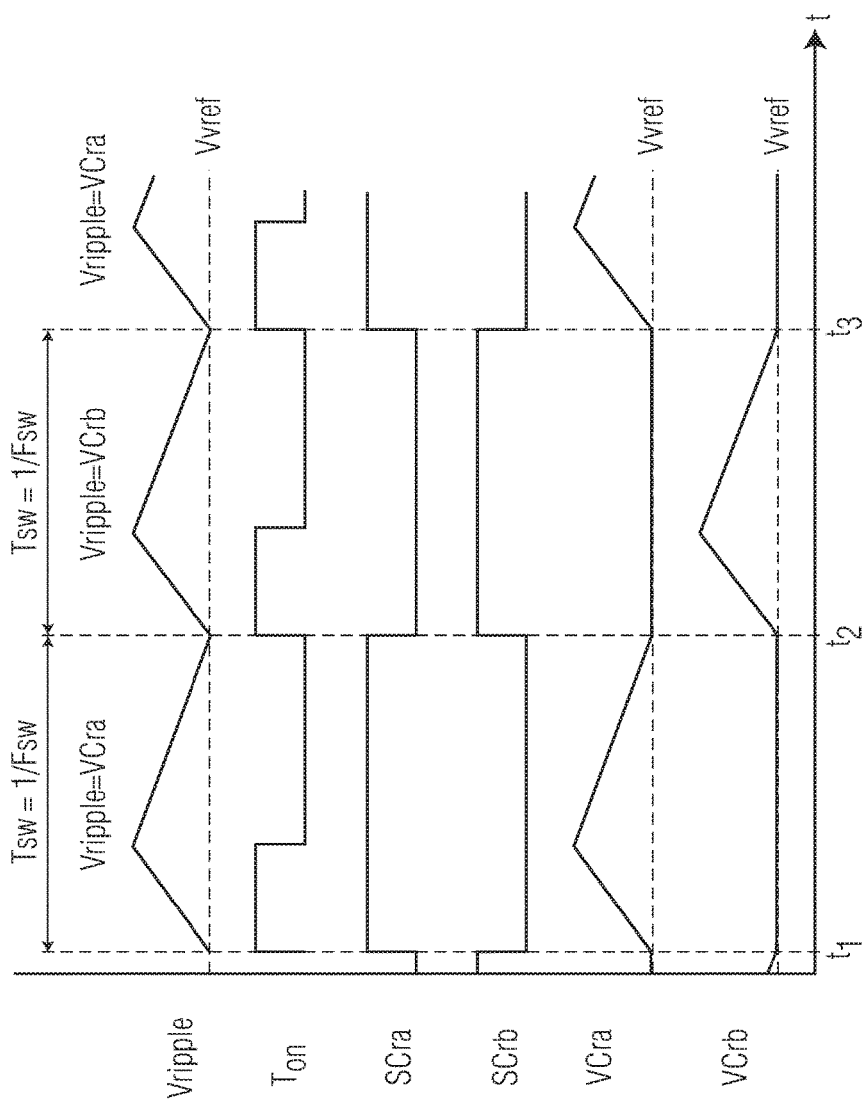
FIG. 4 is a timing diagram that illustrates the relative timing of the ripple voltage, $V_{ripple}$, at the ripple voltage output, the first ripple ramp control signal, SCra, the second ripple ramp control signal, SCrb, the voltage of the first charging capacitor, VCra, and the voltage of the second charging capacitor, VCrb.

Operation of the ripple generation circuit 312 is described with reference to FIG. 3 and FIG. 4. FIG. 4 is a timing diagram that illustrates the relative timing of:

the ripple voltage, Vripple, at the ripple voltage output;
the on signal, $T_{ON}$;
the first ripple ramp control signal, SCra;
the second ripple ramp control signal, SCrb;
the voltage of the first charging capacitor, VCra; and
the voltage of the second charging capacitor, VCrb.

With reference to FIG. 4, the on signal, $T_{ON}$, is generated by the controller 210 of the ripple based constant-on-time DC-DC converter 200 of FIG. 2 as is known in the field and is used to control the switches, Mp and Mn, of the ripple based constant-on-time DC-DC converter. When the on signal is high ($T_{ON}=1$), the ripple based constant-on-time DC-DC converter is charging and when the on signal is low ($T_{ON}=0$), the ripple based constant-on-time DC-DC converter is not charging. As indicated in FIG. 4, the time between the on signal going high two consecutive times defines the switching period, $T_{SW}$, which corresponds to the switching frequency of the ripple based constant-on-time DC-DC converter by $T_{SW}=1/f_{SW}$, where $f_{SW}$ is the switching frequency.

In operation, at time $t_1$, when the on signal goes high ($T_{ON}=1$), the clock generator 366 causes the first ripple ramp control signal, SCra, to go high (SCra=1) and the second ripple ramp control signal, SCrb, to go low (SCrb=0). The first and second ripple ramp control signals stay in their same state until the next time the on signal, $T_{ON}$, goes high. When the first and second ripple ramp control signals are in this state (SCra=1 and SCrb=0), the first charging capacitor, Cra, is exposed to the charge node 360 and the second charging capacitor, Crb, is exposed to the valley reference voltage, $V_{vref}$. At time $t_2$, when the on signal goes high again ($T_{ON}=1$), the clock generator causes the first ripple ramp control signal, SCra to go low (SCra=0) and the second ripple ramp control signal, SCrb, to go high (SCrb=1). When the first and second ripple ramp control signals are in this state (SCra=0 and SCrb=1), the first charging capacitor, Cra, is exposed to the valley reference voltage, $V_{vref}$, and the second charging capacitor, Crb, is exposed to the charge node 360. As illustrated in FIG. 4, the first and second ripple ramp control signals are out-of-phase from each other in that the first ripple ramp control signal, SCra, is high when the second ripple ramp control signal, SCrb, is low and the first ripple ramp control signal, SCra, is low when the second ripple ramp control signal, SCrb, is high.

Although not explicitly shown in FIG. 4, when the on signal goes high ($T_{ON}=1$), the first switch 374 of the ramp bias generator 364 turns on (i.e., closes) and the second switch 376 of the ramp bias generator turns off (i.e., opens), causing an increase in voltage at the charge node 360 and when the on signal goes low ($T_{ON}=0$), the first switch 374 of the ramp bias generator turns off (i.e., opens) and the second switch 376 of the ramp bias generator turns on (i.e., closes), causing a decrease in voltage at the charge node 360. As explained below, the state of the ramp bias generator switches, 374 and 376, influences whether the charging capacitors, Cra and Crb, are charging or discharging, i.e., whether the voltage of the charging capacitors is ramping up or ramping down.

With reference to FIG. 4, in the time from $t_1$ to $t_2$, the first charging capacitor, Cra, charges and discharges according to the state of the ramp bias generator 364 and the second charging capacitor, Crb, is reset to the valley reference voltage, $V_{vref}$. As shown in FIG. 4, the voltage of the first charging capacitor, VCra, ramps up during the on-time ($T_{ON}=1$) and ramps down during the off-time ($T_{ON}=0$) while the voltage of the second charging capacitor, VCrb, is maintained at the valley reference voltage, $V_{vref}$. Because the ramp switch 352 of charging circuit A is open and the ramp switch 352 of charging circuit B is closed, the ripple voltage, Vripple, is the voltage of charging circuit A.

In the time from $t_2$ to $t_3$, the first charging capacitor, Cra, is set to the valley reference voltage, $V_{vref}$, and the second charging capacitor, Crb, charges and discharges according to the state of the ramp bias generator 364. As shown in FIG. 4, the voltage of the second charging capacitor, VCrb, ramps up during the on-time ($T_{ON}=1$) and ramps down during the off-time ($T_{ON}=0$) while the voltage of the first charging capacitor, VCra, is maintained at the valley reference voltage, $V_{vref}$. Because the ramp switch 352 of charging circuit B is open and the ramp switch 352 of charging circuit A is closed, the ripple voltage, Vripple, is the voltage of charging circuit B.

As shown in FIG. 4, the ripple voltage, $V_{ripple}$, is a combination of the voltage of the first charging capacitor, VCra, and the voltage of the second charging capacitor, VCrb. That is, the two voltages are combined in an out-of-phase manner according to the first and second ripple ramp control signals, SCra and SCrb, such that the voltage of only one of the charging capacitors is presented at the ripple voltage output 342 at any one time as the ripple voltage.

In the example of FIGS. 3 and 4, the slope of the voltage of the first charging capacitor, VCra, can be expressed as:

Charging slope: $S1=(V_{IN}-V_{OUT})/(Rr \cdot Cra)$

Discharging slope: $S2=-(V_{OUT})/(Rr \cdot Cra)$ where $V_{IN}$ in the input voltage of the converter, $V_{OUT}$ is the output voltage of the converter, Rr is the resistance that is used to convert the input voltage, $V_{IN}$, and the output voltage, $V_{OUT}$, into current for the current sources 370 and 372, and Cra is the capacitance of the charging capacitor, Cra.

In the example of FIGS. 3 and 4, the slope of the voltage of the second charging capacitor, VCrb, can be expressed as:

Charging slope: $S1=(V_{IN}-V_{OUT})/(Rr \cdot Crb)$

Discharging slope: $S2=-(V_{OUT})/(Rr \cdot Crb)$ where $V_{IN}$ in the input voltage of the converter, $V_{OUT}$ is the output voltage of the converter, Rr is the resistance that is used to convert the input voltage, $V_{IN}$, and the output voltage, $V_{OUT}$, into current for the current sources 370 and 372, and Crb is the capacitance of the charging capacitor, Crb.

As shown above, the slope, and thus the amplitude, of the ripple voltage, $V_{ripple}$, is a function of the capacitance of the charging capacitors, Cra and Crb. Therefore, the amplitude of the ripple voltage, $V_{ripple}$, can be influenced by the capacitance of the charging capacitors.

In an embodiment, the technique for generating a ripple voltage as described herein enables generation of a robust ripple waveform as needed by very fast ripple based constant-on-time DC-DC converters by: minimal use of analog circuitry for fast speed of operation; special circuitry to synthesize a ripple waveform that can emulate the inductor AC current timing and shape correctly; and the ability to adjust and maintain ramp amplitude, peak, and valley; and the ability to work for both continuous conduction mode (CCM) and the discontinuous conduction mode (DCM)

Figure 5:
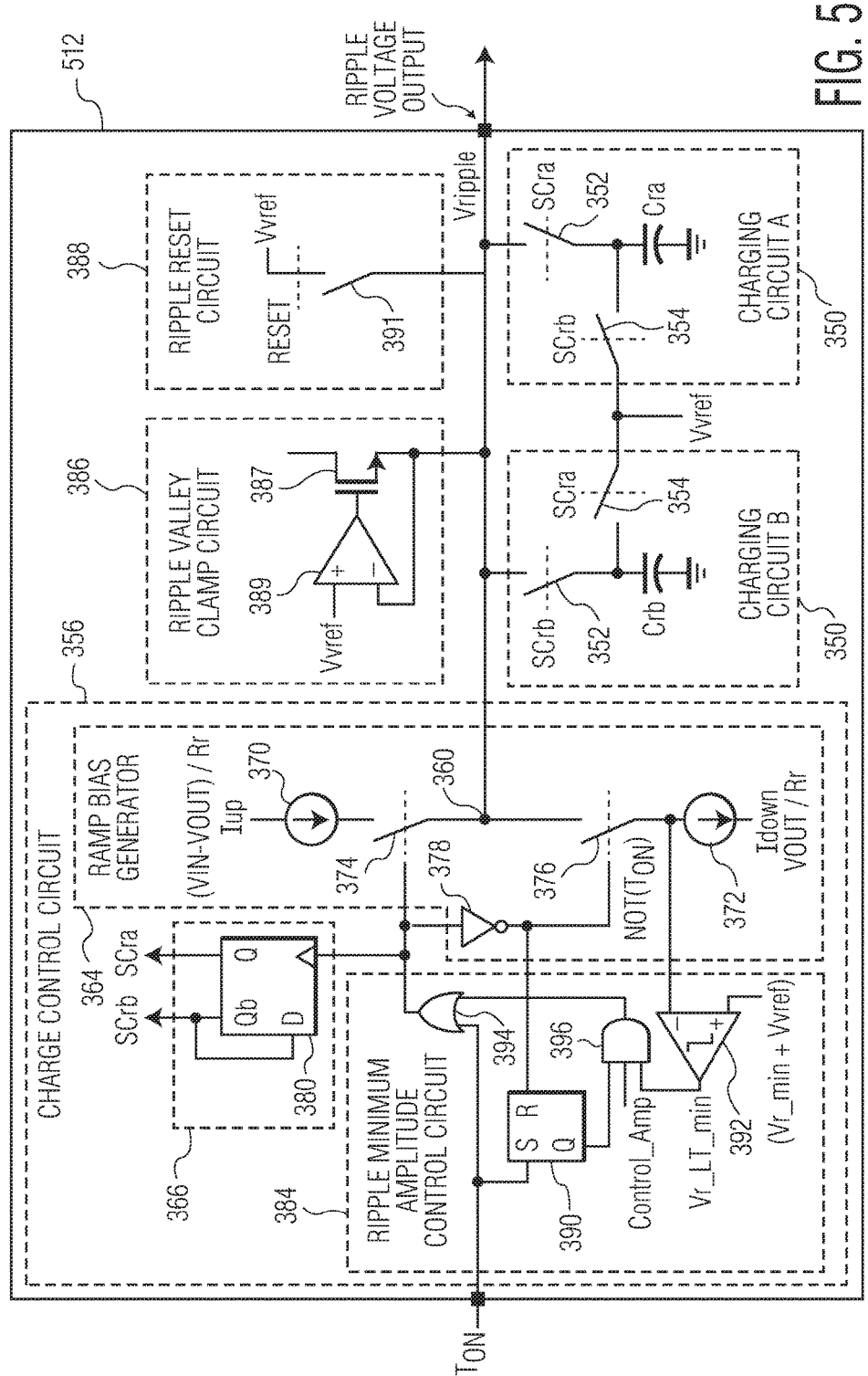
FIG. 5 depicts an embodiment of the ripple generation circuit that includes a ripple minimum amplitude control circuit, a ripple valley clamp circuit, and a ripple reset circuit.

The above-described technique can be used to generate a desirable ripple voltage. Additional techniques can be employed to generate a desirable ripple voltage. For example, the minimum amplitude of the ripple voltage peak can be controlled, the minimum voltage of the ripple voltage valley can be controlled, and a ripple voltage reset can be provided. FIG. 5 depicts an embodiment of the ripple generation circuit that includes the following optional elements: a ripple minimum amplitude control circuit 384; a ripple valley clamp circuit 386; and a ripple reset circuit 388.

These optional elements can be utilized alone or in some combination depending on the application.

The magnitude of the ripple voltage is proportional to the voltage difference between the input voltage, $V_{IN}$, and the output voltage, $V_{OUT}$. Therefore, to support the situation where the input voltage, $V_{IN}$, is close to the output voltage, $V_{OUT}$, the ripple voltage should not be near zero. Thus, ripple minimum amplitude control is used to keep the amplitude (where the amplitude of the ripple voltage is defined as the difference between the peak ripple voltage and the minimum ripple voltage) of the ripple from getting too small, e.g., too close to zero. The ripple minimum amplitude control circuit 384 is configured to control the minimum amplitude of the ripple voltage. With reference to FIG. 5, the ripple minimum amplitude control circuit includes a flip-flop 390, a comparator 392, an OR gate 394, and an AND gate 396. In operation, the amplitude of the ripple voltage is compared to a minimum desired amplitude (e.g., Vr_min+ Vvref) at the comparator 392. If the ripple voltage amplitude is not at least at the minimum desired amplitude and the on signal is high ($T_{ON}$=1), then an extra on-time signal, "ExT$_{ON}$", will go high, forcing the on signal, $T_{ON\_NEW}$, to be extended (held on longer) than the incoming on signal, $T_{ON}$. Extending the pulse width of the on signal, $T_{ON}$, extends the charging time of the corresponding capacitor to increase the amplitude of the ripple voltage. If the amplitude of the ripple voltage is high enough (e.g., at or above the desired minimum amplitude) before the falling edge of the on signal, $T_{ON}$, then the pulse width of the new on signal, $T_{ON\_NEW}$, will be the same as the pulse width of the native on signal, $T_{ON}$. The control signal, Control_Amp, is used to enable or disable the ripple minimum amplitude control circuit. The control signal, Control_Amp, may be provided by the controller 210 of the ripple based constant-on-time DC-DC converter 200.

The ripple valley clamp circuit 386 is configured to control the minimum voltage at a valley (e.g., where a valley is the minimum voltage of the ripple voltage). In an embodiment, the ripple valley clamp circuit is used to support DCM operation. During DCM operation, with a small output load current, the inductor current could decrease to zero at a time shorter than the off time (e.g., when $T_{ON}$=0 or $T_{OFF}$). The ripple valley clamp circuit is configured to keep the ripple voltage at the valley reference voltage, $V_{vref}$, before the reset switch is turned on. With reference to FIG. 5, the ripple valley clamp circuit is an op-amp based voltage clamp that includes a switch 387 and a comparator 389 with the positive input of the comparator connected to the valley reference voltage, $V_{vref}$, and the negative input of the comparator connected to the charge node 360. In the embodiment of FIG. 5, the ripple valley clamp circuit controls the ripple voltage at a valley to be no less than the valley reference voltage, $V_{vref}$.

When the output voltage, $V_{OUT}$, is disturbed such that large and prolonged transient conditions are created inside the DC-DC converter, the on time, $T_{ON}$, and the off time, $T_{OFF}$, could become irregular and the ripple generator will generate irregular waveforms. Typically, the DC-DC converter and the ripple generator will eventually recover automatically. However, if the controller of the DC-DC converter has additional circuitry to detect the above conditions, then resetting the ripple voltage to the valley reference voltage, $V_{vref}$, can shorten the recovery time. The ripple reset circuit 388 is configured to reset the ripple voltage to the valley reference voltage, $V_{vref}$. With reference to FIG. 5, the ripple reset circuit includes a switch 391 that is connected at one side to the charge node 360 and at the other side to the valley reference voltage, $V_{vref}$. The switch is controlled by a reset signal that can be provided, for example, by the controller 210 of the ripple based constant-on-time DC-DC converter 200 (FIG. 2A).

Using the above described technique, a ripple voltage is generated that "emulates" the inductor current, creating an "emulated ripple voltage" using "emulated inductor current ripple generation." In an embodiment, the waveforms of the each of the ripple voltages have controllable charging/ discharging slopes, amplitudes, and valley voltages. By selecting the portion of each waveform to be output to the comparator 214 during the predefined time period, the final ripple ramp can have desirable characteristics. Since the technique reproduces the inductor AC current waveform (shape) faithfully over the converter operating input/output voltages and load current conditions, the technique works well under both CCM and DCM. To improve operational robustness of the ripple based constant-on-time DC-DC converter (e.g., when $V_{IN}$ is close to $V_{OUT}$), the technique can incorporate additional circuitry to control the amplitude to be greater than a predefined minimum to allow proper power conversion when $V_{IN}$ is close to $V_{OUT}$.

Figure 6:
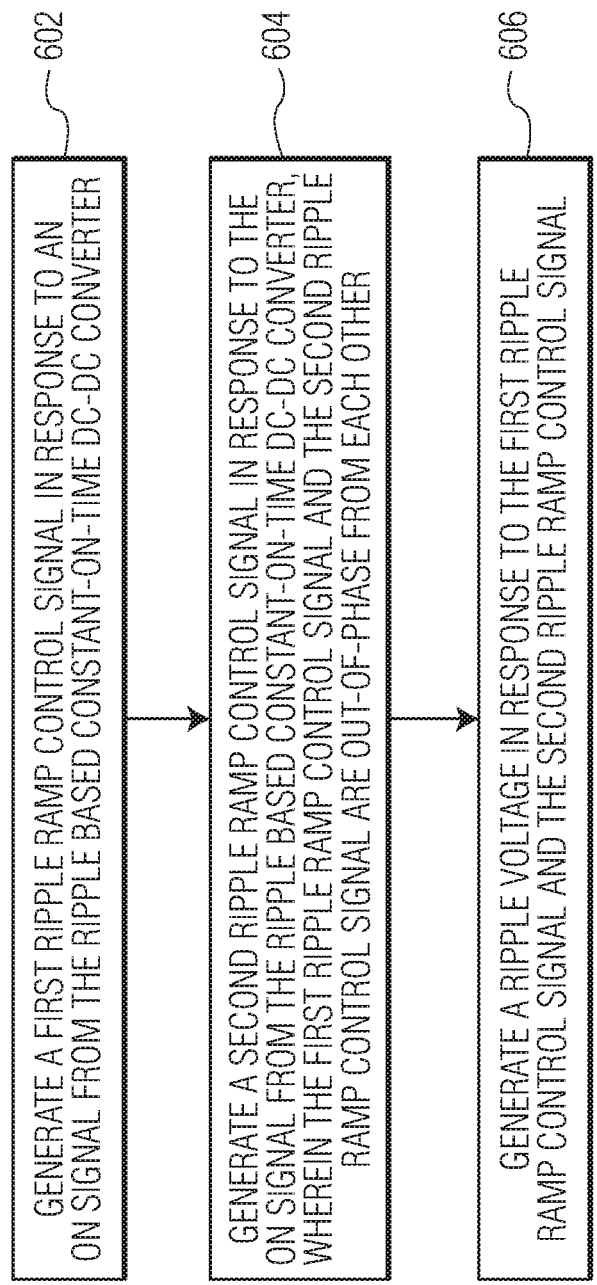
FIG. 6 is a flow diagram of a method for generating a ripple voltage for a ripple based constant-on-time DC-DC converter.

FIG. 6 is a flow diagram of a method for generating a ripple voltage for a ripple based constant-on-time DC-DC converter. At block 602, a first ripple ramp control signal is generated in response to an on signal from the ripple based constant-on-time DC-DC converter. At block 604, a second ripple ramp control signal is generated in response to the on signal from the ripple based constant-on-time DC-DC converter, wherein the first ripple ramp control signal and the second ripple ramp control signal are out-of-phase from each other. At block 606, a ripple voltage is generated in response to the first ripple ramp control signal and the second ripple ramp control signal. The above described method can be implemented using the ripple generation circuit described above.

Although the technique for generating a ripple voltage is described with two charging circuits, the technique can be implemented with more than two charging circuits. For example, the ripple generation circuit may include more than two charging circuits and in such a case, the out-of-phase timing of the charging is adjusted to correspond to the number of charging circuits. Additionally, although the technique for generating a ripple voltage is described with reference to a buck converter, the technique for generating a ripple voltage is applicable to a boost converter.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit for generating a ripple voltage for a ripple based constant-on-time DC-DC converter, the circuit comprising:
    a ripple voltage output;
    a first charging circuit connected to the ripple voltage output;
    a second charging circuit connected to the ripple voltage output;
    a charge control circuit configured to charge the first charging circuit and the second charging circuit out-of-phase from each other in response to an on signal from a ripple based constant-on-time DC-DC converter;
    wherein the voltage of the first charging circuit and the voltage of the second charging circuit are provided at the ripple voltage output as the ripple voltage.

2. The circuit of claim 1,
    wherein the charge control circuit is configured
        to charge the first charging circuit while the second charging circuit is discharging and
        to discharge the first charging circuit while the second charging circuit is charging.

3. The circuit of claim 1,
    wherein the charge control circuit includes a ramp bias generator comprising two switchable current sources and a clock generator,
    the clock generator configured
        to generate a first ripple ramp control signal in response to the on signal from the ripple based constant-on-time DC-DC converter and
        to generate a second ripple ramp control signal in response to the one signal from the ripple based constant-on-time DC-DC converter,
    wherein the first ripple ramp control signal and the second ripple ramp control signal are out-of-phase from each other.

4. The circuit of claim 1,
    wherein the first charging circuit includes a first charging capacitor and two switches and
    wherein the second charging circuit includes a second charging capacitor and two switches.

5. The circuit of claim 4,
    wherein one of the two switches of the first charging circuit is connected between the first charging capacitor and a reference voltage and
    the other of the two switches of the first charging circuit is connected between the first charging capacitor and a ramp bias generator and
    one of the two switches of the second charging circuit is connected between the second charging capacitor and the reference voltage and
    the other of the two switches of the second charging circuit is connected between the second charging capacitor and the ramp bias generator.

6. The circuit of claim 1, wherein the charge control circuit includes
    a ripple minimum amplitude control circuit configured
        to compare the amplitude of the ripple voltage to a minimum reference voltage and
        to extend the duration of the on signal when the amplitude of the ripple voltage is less than the minimum reference voltage.

7. The circuit of claim 1, further comprising
    a ripple valley clamp circuit configured to maintain a valley of the ripple voltage at least at a reference voltage.

8. The circuit of claim 2,
    wherein the charge control circuit includes a ramp bias generator comprising
        two switchable current sources and
        a clock generator configured
            to generate a first ripple ramp control signal in response to the on signal from the ripple based constant-on-time DC-DC converter and
            to generate a second ripple ramp control signal in response to the on signal from the ripple based constant-on-time DC-DC converter,
    wherein the first ripple ramp control signal and the second ripple ramp control signal are out-of-phase from each other.

9. The circuit of claim 8,
    wherein the first charging circuit includes a first charging capacitor and two switches and
    wherein the second charging circuit includes a second charging capacitor and two switches,
    wherein one switch of the first charging circuit and one switch of the second charging circuit are controlled by the first ripple ramp control signal and
    wherein one switch of the first charging circuit and one switch of the second charging circuit are controlled by the second ripple ramp control signal.

10. The circuit of claim 9, wherein
    one of the two switches of the first charging circuit is connected between the first charging capacitor and a reference voltage and
    the other of the two switches of the first charging circuit is connected between the first charging capacitor and the ramp bias generator and
    one of the two switches of the second charging circuit is connected between the second charging capacitor and the reference voltage and
    the other of the two switches of the second charging circuit is connected between the second charging capacitor and the ramp bias generator.

11. The circuit of claim 10, wherein the charge control circuit includes
    a ripple minimum amplitude control circuit
        configured to compare the amplitude of the ripple voltage to a minimum reference voltage and configured to extend the duration of the on signal when the amplitude of the ripple voltage is less than the minimum reference voltage.

12. The circuit of claim 11, further comprising
a ripple valley clamp circuit configured to maintain a valley of the ripple voltage at least at a reference voltage.

13. An inductor current ripple based constant-on-time DC-DC buck converter comprising the circuit of claim 1.

14. A method for generating a ripple voltage for a ripple based constant-on-time DC-DC converter, the method comprising:
generating a first ripple ramp control signal in response to an on signal from the ripple based constant-on-time DC-DC converter;
generating a second ripple ramp control signal in response to the on signal from the ripple based constant-on-time DC-DC converter;
wherein the first ripple ramp control signal and the second ripple ramp control signal are out-of-phase from each other; and
generating a ripple voltage in response to the first ripple ramp control signal and the second ripple ramp control signal.

15. The method of claim 14,
wherein generating the ripple voltage in response to the first ripple ramp control signal and the second ripple ramp control signal comprises:
controlling charging and discharging of voltage from a first charging circuit using the first ripple ramp control signal and the second ripple ramp control signal;
controlling charging and discharging of voltage from a second charging circuit using the first ripple ramp control signal and the second ripple ramp control signal; and
providing the voltage of the first charging circuit and the voltage of the second charging circuit as the ripple voltage.

16. The method of claim 15,
wherein the first charging circuit is charging while the second charging circuit is discharging and wherein the first charging circuit is discharging while the second charging circuit is charging.

17. The method of claim 15,
wherein charging of the first charging circuit is initiated by the first ripple ramp control signal and charging of the second charging circuit is initiated by the second ripple ramp control signal.

18. The method of claim 14, further comprising
controlling the minimum amplitude of the ripple voltage to ensure that the amplitude of the ripple voltage is at least at a reference voltage.

19. The method of claim 14, further comprising
comparing the amplitude of the ripple voltage to a minimum reference voltage and extending the duration of the on signal when the amplitude of the ripple voltage is less than the minimum reference voltage.

20. The method of claim 14,
wherein generating the ripple voltage in response to the first ripple ramp control signal and the second ripple ramp control signal comprises:
controlling charging and discharging of voltage from a first charging circuit using the first ripple ramp control signal and the second ripple ramp control signal;
controlling charging and discharging of voltage from a second charging circuit using the first ripple ramp control signal and the second ripple ramp control signal;
wherein the first charging circuit is charging while the second charging circuit is discharging and wherein the first charging circuit is discharging while the second charging circuit is charging;
wherein charging of the first charging circuit is initiated by the first ripple ramp control signal and charging of the second charging circuit is initiated by the second ripple ramp control signal; and
providing the voltage of the first charging circuit and the voltage of the second charging circuit as the ripple voltage.

* * * * *